(12) United States Patent
Hwang

(10) Patent No.: US 6,308,403 B1
(45) Date of Patent: Oct. 30, 2001

(54) HEAD ASSEMBLY FOR PART MOUNTING APPARATUS AND PART MOUNTING APPARATUS ADOPTING THE SAME

(75) Inventor: Young-soo Hwang, Kyongsangnam-do (KR)

(73) Assignee: Samsung Aerospace Industries, Ltd., Kyongsangnam-do (KR)

( * ) Notice: Subject to any disclaimer, the term of this patent is extended or adjusted under 35 U.S.C. 154(b) by 0 days.

(21) Appl. No.: 09/524,789

(22) Filed: Mar. 13, 2000

(30) Foreign Application Priority Data

Mar. 13, 1999 (KR) .................................................. 99-8479

(51) Int. Cl.⁷ ...................................................... H05K 3/30
(52) U.S. Cl. ................................ 29/740; 29/743; 29/840; 29/834; 29/DIG. 44; 294/64.1
(58) Field of Search ............................. 29/740, 743, 834, 29/DIG. 44, 840; 294/2, 64.1; 414/737, 752

(56) References Cited

U.S. PATENT DOCUMENTS

| | | | |
|---|---|---|---|
| 4,451,976 | * 6/1984 | Fujita et al. | 29/740 |
| 4,498,023 | * 2/1985 | Stout | 310/14 |
| 5,070,598 | * 12/1991 | Itagaki et al. | 29/705 |
| 5,397,423 | * 3/1995 | Bantz et al. | 156/362 |
| 5,588,195 | * 12/1996 | Asai et al. | 29/33 M |
| 5,850,683 | * 12/1998 | Okazaki et al. | 29/740 |

FOREIGN PATENT DOCUMENTS

| | | |
|---|---|---|
| 10-163686 | * 6/1998 | (JP) . |
| 11-68389 | * 3/1999 | (JP) . |
| 11-198079 | * 7/1999 | (JP) . |

\* cited by examiner

Primary Examiner—Lee Young
Assistant Examiner—Minh Trinh
(74) Attorney, Agent, or Firm—Finnegan, Henderson, Farabow, Garrett & Dunner L.L.P.

(57) ABSTRACT

A head assembly for a part mounting apparatus includes a housing, a plurality of rod housings installed to be capable of elevating with respect to the housing, a plurality of voice coil motors fixed to the housing to be capable of elevating the respective rod housings, a plurality of spindle motors, each having a part picking device at an end portion thereof, installed to be capable or rotating with respect to the respective rod housings and elevating together according to the elevation of the rod housings, a plurality of linear position transformers installed at the respective voice coil motors for detecting and controlling the position of elevation of each of the rod housings, a first pinion gear installed at the outer circumferential surface of the spindle unit to rotate the spindle unit, a rack gear engaged with the first pinion gear and reciprocating with respect to the housing, a rack gear driving motor installed at one side of the housing to linearly reciprocate the rack gear, and second pinion gear coupled to a rotation shaft of the rack gear driving motor and engaged with the rack gear.

7 Claims, 10 Drawing Sheets

HEAD ASSEMBLY FOR PART MOUNTING APPARATUS AND PART MOUNTING APPARATUS ADOPTING THE SAME

BACKGROUND OF THE INVENTION

1. Field of the Invention

The present invention relates to a part mounting apparatus, and more particularly, to a head assembly for a part mounting apparatus having a plurality of spindle units, and a part mounting apparatus adopting the same.

2. Description of the Related Art

Part mounting apparatuses having a fast and accurate mounting function have been developed in response to the needs of high integration, high functions and being small and light weight of various electronic devices. The performance of the part mounting apparatus is determined by various factors, in particular, by how a head where an absorbing nozzle is installed for absorbing parts can be rapidly and accurately moved and located at a predetermined position. To rapidly and accurately position the head at a desired position, the size and weight of the head needs to be decreased. Also, to accurately grab a part, many methods and apparatuses have been developed.

Typically, a head performs a vertical elevation movement and a rotation movement. For these two movements, a timing belt, gear or ball screw is used as a power transfer mechanism. That is, in a conventional part mounting apparatus, a spindle installed at a head is elevated up and down and rotated to mount parts on a printed circuit board. Here, the power of a motor is transferred to the spindle through a power transfer means such as a timing belt, gear or ball screw so that parts are mounted.

However, in a typical part mounting apparatus having the above power transfer mechanism, the power generated from a driving shaft of a motor is not accurately transferred to a spindle due to sagging of the timing belt or backlash of the gear. Thus, accuracy of part mounting cannot be expected. In particular, the tension of the timing belt changes according to changes in temperature so that the rotation force of the motor cannot be accurately transferred to the spindle performing elevating and rotation movements. Also, thermal and mechanical durability of the belt itself cannot be guaranteed. Also, the structure of the head becomes complicated and the weight thereof increases so that fast and accurate position selection of the head is difficult and also repair and maintenance of the apparatus is difficult.

SUMMARY OF THE INVENTION

To solve the above problems, it is an objective of the present invention to provide a head assembly for a part mounting apparatus in which a spindle can accurately perform an elevation movement and a rotation movement.

It is another object of the present invention to provide a head assembly for a part mounting apparatus in which a plurality of absorbing nozzles and spindles are installed inside a housing so that many parts can be simultaneously gripped and mounted.

It is yet another objective of the present invention to provide a head assembly for a part mounting apparatus which has a simple structure and is small and light weight and simultaneously a part mounting operation of a high efficiency is possible.

It is yet further another objective of the present invention to provide a part mounting apparatus adopting the above head assembly so that a highly efficient work can be done.

Accordingly, to achieve the above objectives, there is provided a head assembly for a part mounting apparatus comprising a housing, a plurality of rod housings installed to be capable of elevating with respect to the housing, a plurality of voice coil motors fixed to the housing to be capable of elevating the respective rod housings, a plurality of spindle motors, each having a part picking device at an end portion thereof, installed to be capable of rotating with respect to the respective rod housings and elevating together according to the elevation of the rod housings, and a plurality of linear position transformers installed at the respective voice coil motors for detecting and controlling the position of elevation of each of the rod housings.

It is preferred in the present invention that the head assembly further comprises a first gear installed at the outer circumferential surface of each of the spindle units for rotating each spindle unit, a rack gear engaged with the first gear and linearly reciprocating with respect to the housing, and a driving means installed at one side of the housing for driving the rack gear to linearly reciprocate.

It is also preferred in the present invention that the driving means is a motor installed at one side of the housing and a second gear installed at a rotation shaft of the motor is engaged with the rack gear.

It is also preferred in the present invention that the driving motor is a linear motor which is installed to make the rack gear perform a linear movement.

It is also preferred in the present invention that the housing comprises an upper portion where an insertion hole for inserting the linear position transformer is formed and a body portion where an insertion hole for inserting the spindle motor is formed, and a rack gear guide installation surface where the rack gear is installed is formed between the upper portion and the body portion.

It is also preferred in the present invention that each of the rod housings comprises a pair of first rod housing and a second rod housing, a coupling surface coupled to an moving portion of the voice coil motor and an insertion hole for inserting the spindle unit are formed at the upper portion of each of the rod housings, and the insertion holes formed in the first and second rod housings are linearly arranged while the coupling surfaces are arranged to be separated far apart from one another.

It is also preferred in the present invention that the head assembly further comprises first and second pinion gears fixed to the outer circumferential surface of the spindle unit and the driving motor, respectively, wherein each of the pinion gears has first and second gears having at least one pair of a protrusion and a groove and a spring elastically and rotatably supported between the first and second gears.

It is also preferred in the present invention that a hollow portion is formed in the voice coil motor, the linear position transformer is inserted in the hollow portion, and one side of the linear position transformer is connected to the moving portion of the voice coil motor so that the position of the moving portion of the voice coil motor is detected and controlled.

It is also preferred in the present invention that the linear position transformer is operated to change the descending speed of the voice coil motor when the absorbing nozzle arrives at a set position above the surface of a part or a printed circuit board.

To achieve the above objectives, there is provided a part mounting apparatus adopting a head assembly comprises a housing, a plurality of rod housings installed to be capable of elevating with respect to the housing, a plurality of voice coil motors fixed to the housing to be capable of elevating the respective rod housings, a plurality of spindle motors, each having a part picking device at an end portion thereof, installed to be capable of rotating with respect to the respective rod housings and elevating together according to the elevation of the rod housings, and a plurality of linear position transformers installed at the respective voice coil motors for detecting and controlling the position of elevation of each of the rod housings.

BRIEF DESCRIPTION OF THE DRAWINGS

The above objectives and advantages of the present invention will become more apparent by describing in detail a preferred embodiment thereof with reference to the attaching drawings in which.

DETAILED DESCRIPTION OF THE INVENTION

Figure 1:
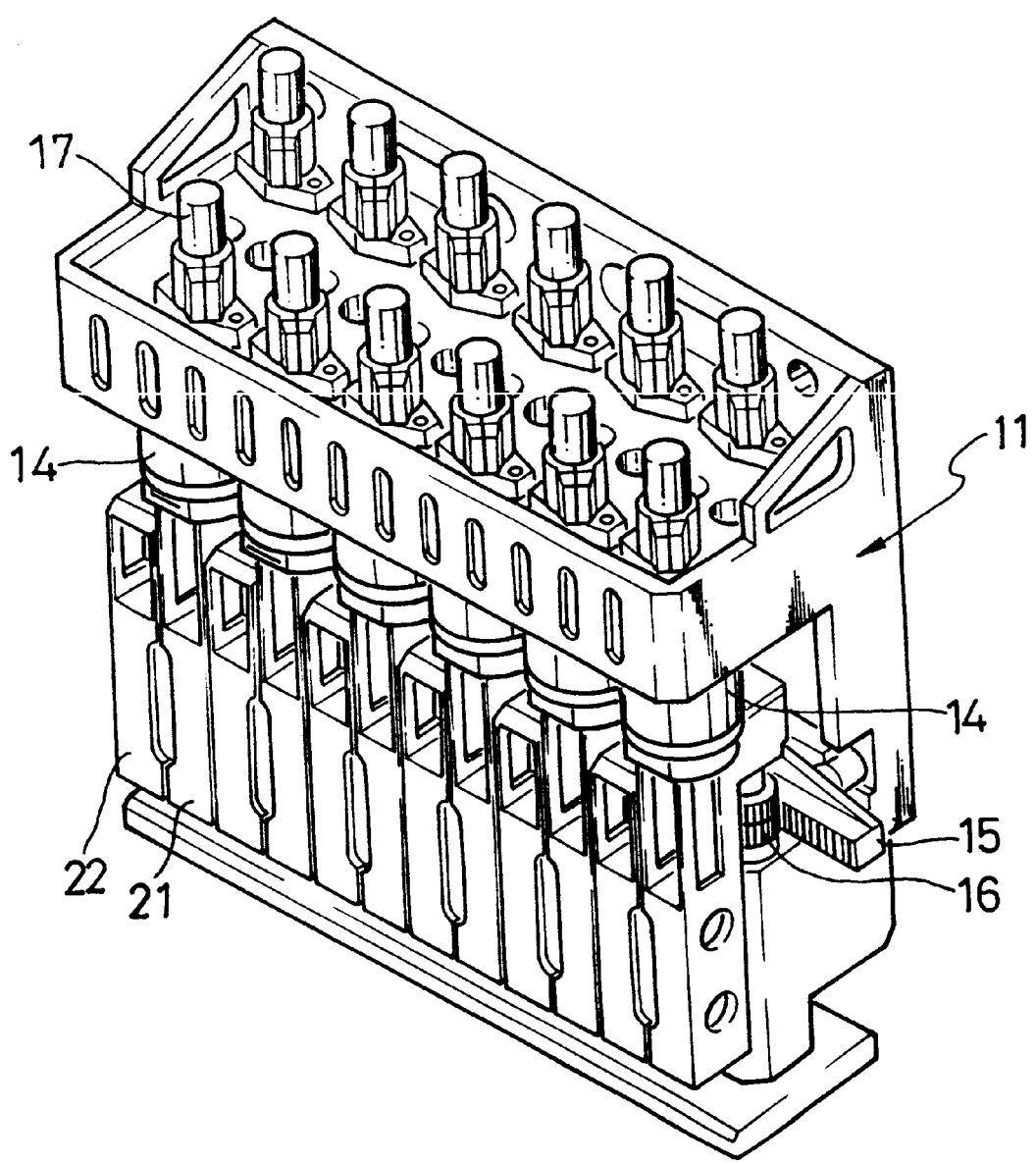
FIG. 1 is a perspective view showing a head assembly according to the present invention.

Referring to FIG. 1, a head assembly for a part mounting apparatus according to the present invention includes a housing 11, a plurality of first and second rod housings 21 and 22 installed in the housing 11, a plurality of voice coil motors 14 providing a driving force for elevating the first and second rod housings 21 and 22, a plurality of spindle units (40 of FIG. 2) installed at the first rod housing 21, a plurality of linear position transformers 17 installed through inner holes of the voice coil motors 14 for controlling the elevating position of the spindle units 40, a pinion gear (16 of FIG. 2) installed at the outer circumference surface of the spindle unit 40 to rotate the spindle unit 40, a rack gear 15 engaged with the pinion gear 16, and a motor (51 of FIG. 5) having a rotation shaft at which a pinion gear (52 of FIG. 5) is installed to linearly drive the rack gear 15. In other preferred embodiments not shown in the drawings, the motor 51 can be replaced by a linear motor. When a linear motor is applied, for accurate position control of the linear motor, an encoder or an additional linear position transformer is provided so that a linear reciprocation movement of the rack gear can be controlled. When the linear motor is used, backlash which can be generated between teeth of a gear can be prevented. (In another preferred embodiment, the rotation movement of the spindle unit 40 can be realized by using a pulley and belt instead of the rack gear 15 and the pinion gear 16.)

As shown in FIG. 1, twelve linear position transformers 17 are installed at the upper portion of the housing 11 and the spindle units 40 (see FIG. 2) corresponding to the number of linear position transformers 17 can be installed in the single housing 11. That is, six first rod housings 21 and six second rod housings 22 include a corresponding number of voice coil motors 14 and the spindle units so that a total of twelve spindle units can be installed at the housing 11.

Figure 2:
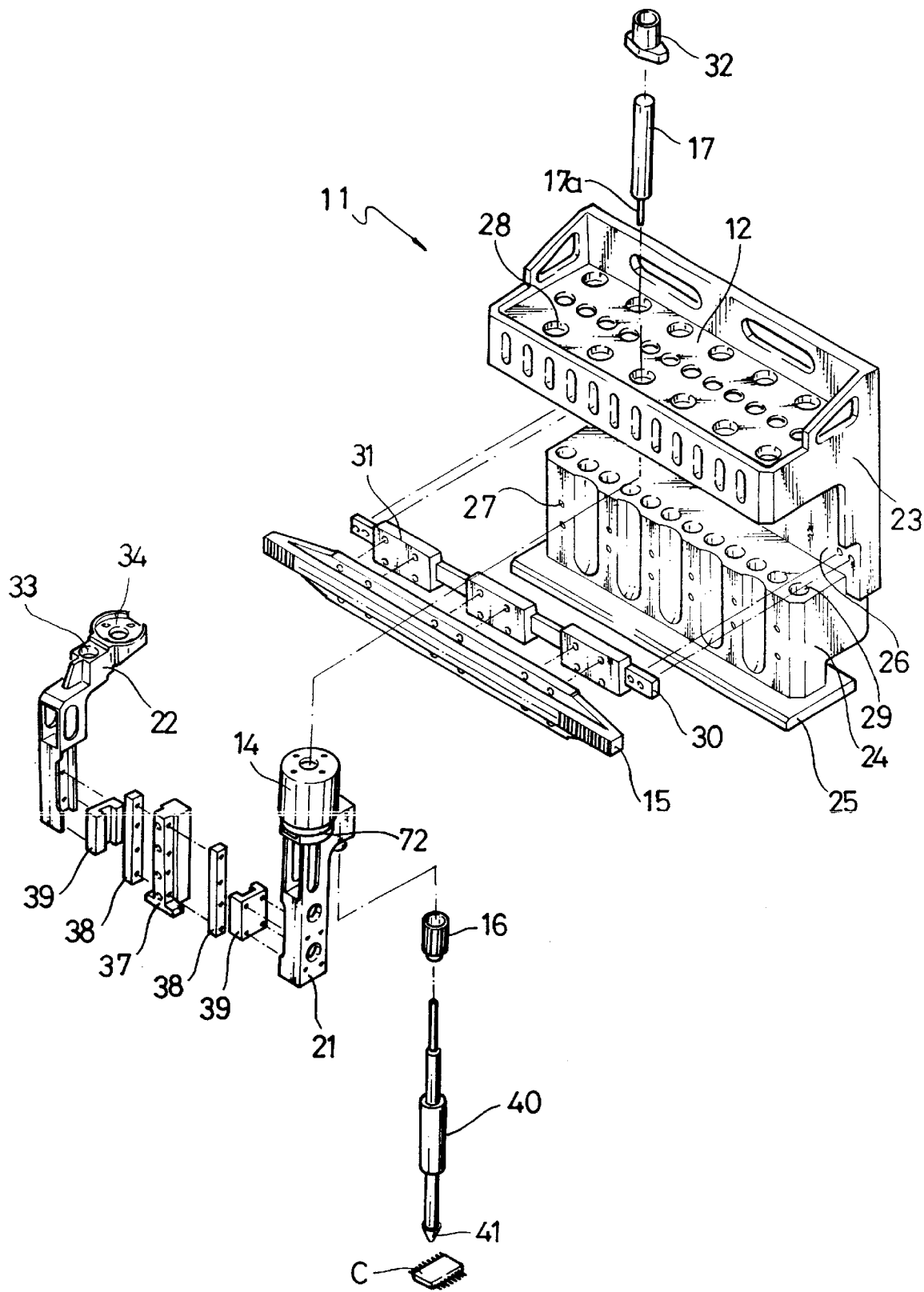
FIG. 2 is an exploded perspective view of a part of the head assembly.

FIG. 2 is an exploded perspective view of a part of the head assembly shown in FIG. 1. Referring to FIG. 2, the housing 11 includes an upper portion 23 where a plurality of holes 28 for inserting the linear position transformer 17 are formed, a body portion 24 where a plurality of spindle insertion holes 29 are formed, and a lower portion 25 formed at the lower portion of the body portion 24. The linear position transformer insertion holes 28 formed in the upper portion 23 are formed in two rows of six linearly arranged insertion holes 28. Also, an installation surface 12 of a mount 32, at which the linear position transformer 17 is installed, is formed at the upper surface of the upper portion 23. Twelve spindle insertion holes 29 for inserting the spindle units 40 are linearly arranged at the body portion 24. In the drawing, an installation surface 27 where a mount 37 of a linear guide 38 for guiding the rod housing 21 and 22 is installed is formed at the front surface of the body portion 24. Six installation surfaces 27 are formed.

A rack gear guide installation surface 26 is formed between the upper portion 23 of the housing 11 and the body portion 24. A linear guide 30 is installed at the rack gear installation surface 26. A bearing 31 linearly reciprocates along the linear guide 30. The rack gear 15 is installed at the front surface of the linear guide 30. Thus, the rack gear 15 can linearly reciprocate in a horizontal direction with respect to the housing 11.

Of the twelve spindle units 40 installed at the housing 11, six spindle units 40 are maintained by the first rod housing 21 and the other six spindle units 40 are maintained by the second rod housing 22. Each of the first and second rod housings 21 and 22 forms a pair so that six pairs of the first and second rod housings 21 and 22 are provided. FIG. 2 shows a pair of rod housing 21 and 22.

Figure 3:
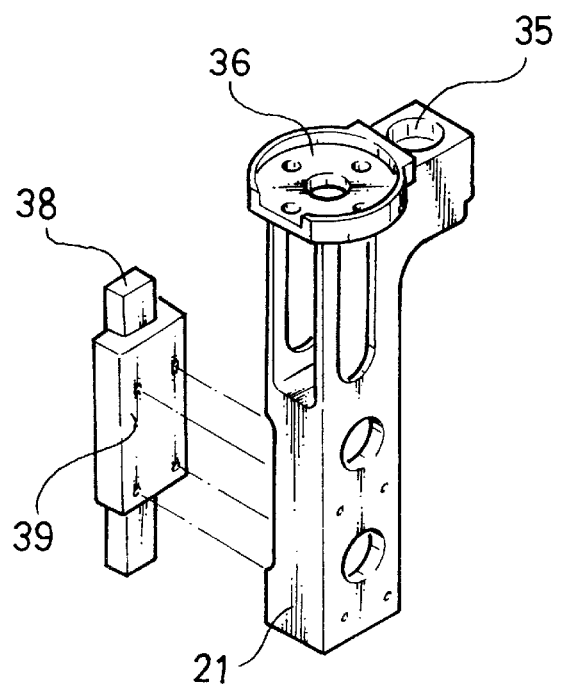
FIG. 3 is a perspective view showing the first rod housing.

FIG. 3 shows the first rod housing 21 in a disassembled state. Referring to the drawing, a motor coupling surface 36 where a motor can be arranged is formed on the upper portion of the first rod housing 21 and a spindle insertion hole 35 is formed at the side thereof. Also, a slide bearing 39 can be fixed to the other side of the first rod housing 21 and the slide bearing 39 elevates along the linear guide 38. The first rod housing 21 moves up and down with the slide bearing 39.

Figure 4:
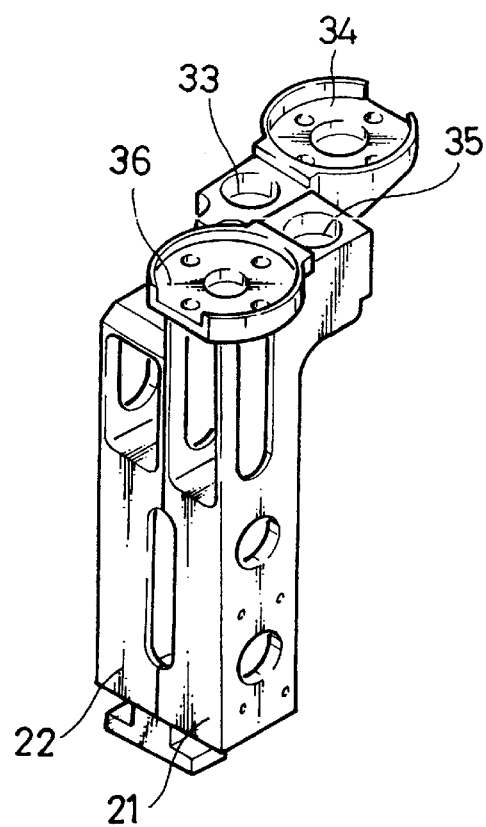
FIG. 4 is a perspective view showing a state in which the first and second rod housings are assembled.

FIG. 4 shows the first rod housing 21 and the second rod housing 22 coupled to each other. Referring to the drawing, when a pair of the first and second rod housings 21 and 22 are assembled, the spindle unit insertion holes 33 and 35 respectively formed at the second and first rod housings 22 and 21 are arranged in-line close to each other. Also, it can be seen that the motor coupling surfaces 36 and 34 are arranged to be separated far apart from each other. This is because the motor coupling surface 34 is horizontally extended at the upper portion of the second rod housing 22, as shown in FIG. 2.

Referring back to FIG. 2, the voice coil motor 14 is arranged on the upper surface of each of the first and second rod housings 21 and 22. In FIG. 2, only the voice coil motor 14 arranged on the first rod housing 21 is shown. A moving portion of the voice coil motor 14 is formed to have a hollow portion and the linear position transformer 17 is inserted through the hollow portion of the voice coil motor 14.

The first and second rod housings 21 and 22 are installed to be capable of moving up and down with respect to the housing 11 by a driving force of the voice coil motor 14. That is, the linear guide mount 37 is mounted on the mount installation surface 27 of the housing 11 and the linear guide 38 is installed at both surfaces of the linear guide mount 37. The slide bearing 39 can elevate along the linear guide 38 and the first and second rod housings 21 and 22 fixed to the slide bearing 39 can elevate. The voice coil motor 14 is installed in the space formed inside the upper portion 23 of the housing 11 and the moving portion 72 of the voice coil motor 14 makes the first and second rod housings 21 and 22 elevate.

The upper portion of the spindle unit 40 is installed to be capable of rotating with respect to the spindle unit insertion holes 33 and 35 of the second and first rod housings 22 and 21. Also, the pinion gear is installed at the outer circumferential surface of the middle portion of the spindle unit 40 and the pinion gear 16 is engaged with the rack gear 15. The middle portion of the spindle unit 40 is rotatably inserted in the spindle insertion hole 29 formed in the body portion 24 of the housing 11.

An absorbing nozzle 41 is installed at the lower portion of the spindle unit 40 and the absorbing nozzle 41 can grip a part C by vacuum applied thereto. The spindle unit 40 can elevate a predetermined distance by the elevation operation of the first and second rod housings 21 and 22 and is rotated by interactive operation between the pinion gear 16 installed at the outer circumferential surface of the spindle unit 40 and the rack gear 15 engaged therewith.

Figure 5:
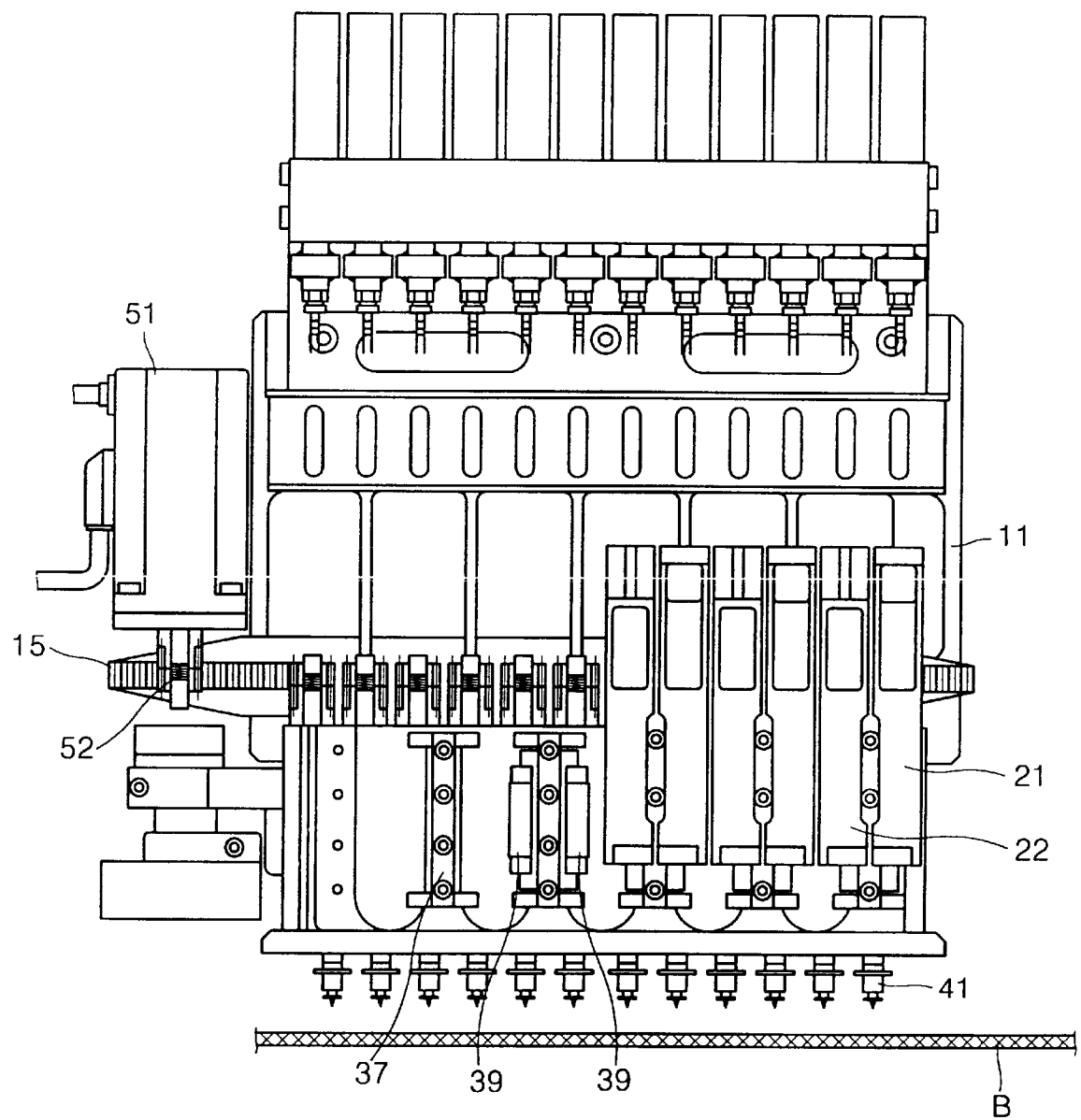
FIG. 5 is a front side view of the head assembly.

FIG. 5 shows the front side of the head assembly shown in FIG. 2. Referring to the drawing, the motor 51 for linearly reciprocating the rack gear 15 is installed to the left of the housing 11. The pinion gear 52 is installed at a rotation shaft of the motor 51 and engaged with the rack gear 15. The assembled state of the first rod housing 21 and the second rod housing 22 can be understood from FIG. 5. A printed circuit board (B) on which parts are mounted is arranged under the absorbing nozzle 41.

Figure 6:
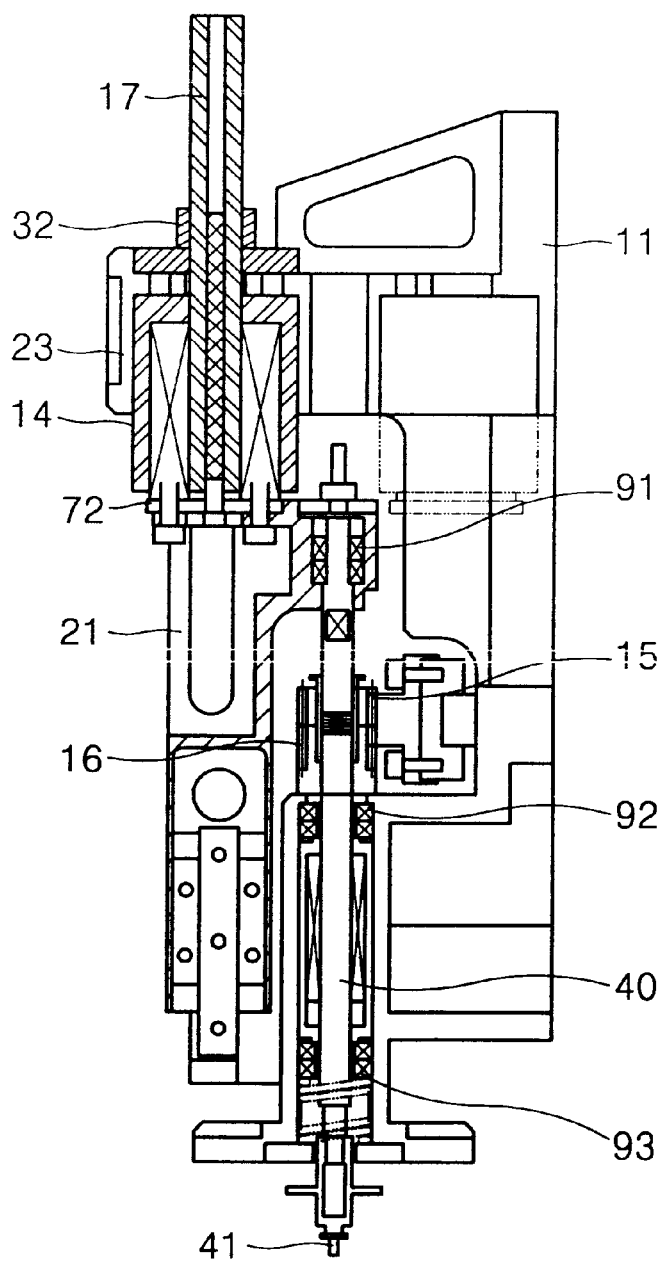
FIG. 6 is a sectional view taken along the first rod housing.

FIG. 6 is a sectional view of the housing 11 taken along the first rod housing 21. Referring to the drawing, the voice coil motor 14 is installed inside the upper portion of the housing 11 and the linear position transformer 17 is inserted in the hollow portion of the voice coil motor 14. The moving portion 72 of the voice coil motor 14 is coupled to the motor coupling surface 36 formed on the upper portion of the first rod housing 21. The linear position transformer 17 is maintained by the mount 32 installed at the upper portion of the housing 11. The upper portion of the spindle motor 40 is rotatably installed with respect to the first rod housing 21 and can elevate as the first rod housing 21 elevates.

Figure 7:
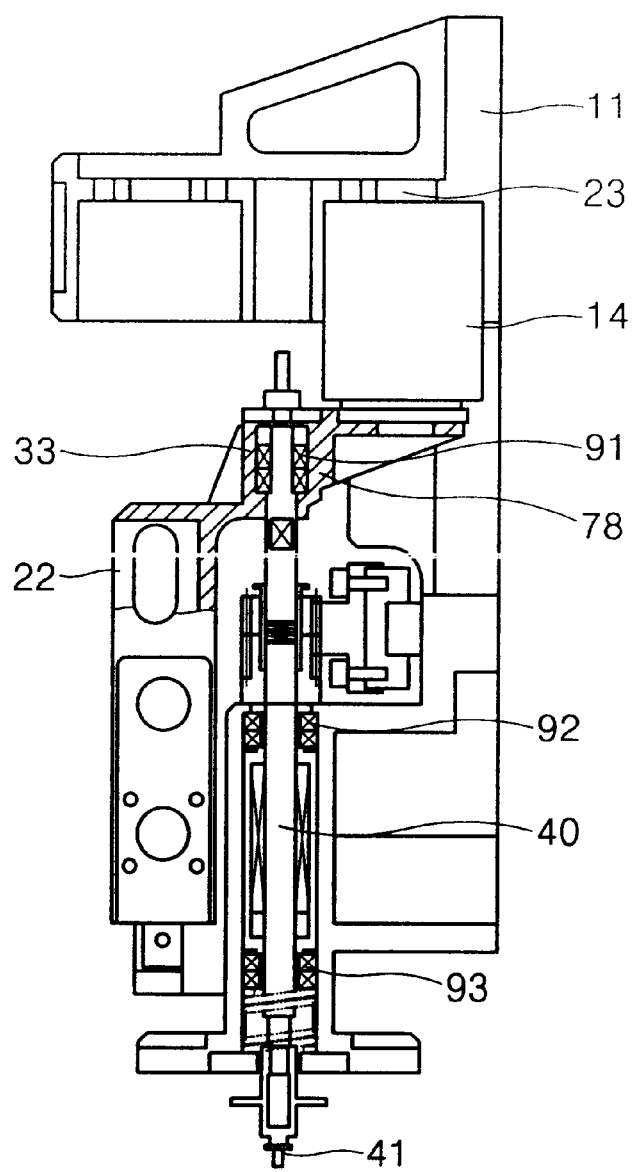
FIG. 7 is a sectional view taken along the second rod housing.

FIG. 7 is a sectional view of the housing 11 taken along the second rod housing 21. Referring to the drawing, an extension portion 78 is horizontally formed at the upper portion of the second rod housing 22. The motor coupling surface 34 is formed on the upper portion of the extension portion 78, as shown in FIG. 2. The spindle unit 40 is inserted in the spindle unit insertion hole 33 of the second rod housing 22 and then inserted in the spindle insertion hole 29 formed in the body portion 24 of the housing 11. The voice coil motor 14 is arranged inside the upper portion of the housing 11 to the rear thereof, unlike the case shown in FIG. 6. In FIG. 7, the linear position transformer 17 to be inserted through the hollow portion of the voice coil motor is omitted.

Figure 8:
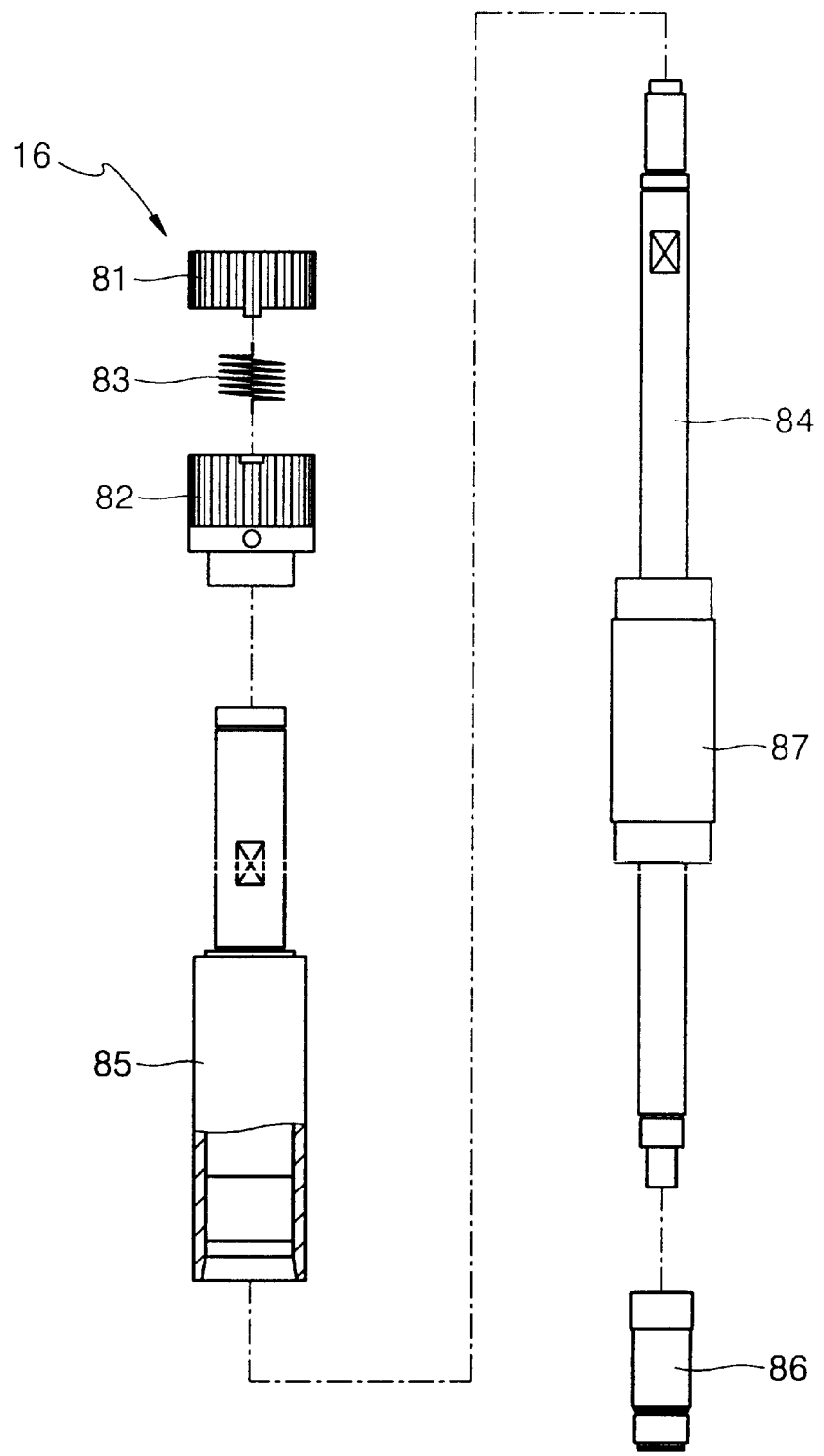
FIG. 8 is an exploded view showing a spindle unit.

FIG. 8 is an exploded view of the spindle unit. Referring to the drawing, a ball spline 87 is installed at the outer circumferential surface of the spindle 84. A spindle tube 85 is inserted around the ball spline 87 and the pinion gear 16 fits around the outer circumferential surface of the spindle tube 85. A nozzle bushing 86 is installed at the lower end portion of the spindle 84. The nozzle bushing 86 supports the absorbing nozzle 41 shown in FIG. 2 to be maintained at the lower end portion of the spindle 84. The pinion gear 16 installed at the outer circumferential surface of the spindle tube 85 is formed of a first gear 81, a second gear 82 and a spring 83 which is elastically supported between the first and second gears 81 and 82. The above structure of the pinion gear 16 is for preventing backlash during operation, which will be further described later.

Figure 9:
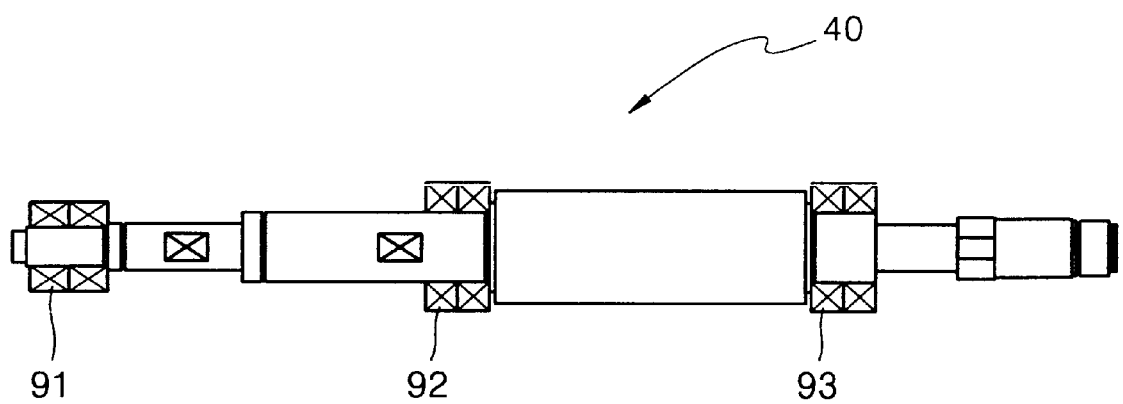
FIG. 9 is a front side view showing the spindle unit in a state in which bearings are assembled.

FIG. 9 shows a ball bearing installed at the outer portion of the spindle unit 40. A first bearing 91 is installed at the upper end of the spindle unit 40 and rotatably maintained with respect to the spindle unit insertion holes 33 and 35 of the first and second rod housings 21 and 22, as shown in FIG. 2. Also, second and third bearings 92 and 93 are installed at the middle portion of the spindle unit 40 for maintaining the spindle unit 40 to be capable of rotating in the spindle insertion hole 29 formed in the body portion 24 of the housing 11. The installation state of the first through third bearings 91, 92 and 93 can be understood from FIGS. 6 and 7.

Figure 10:
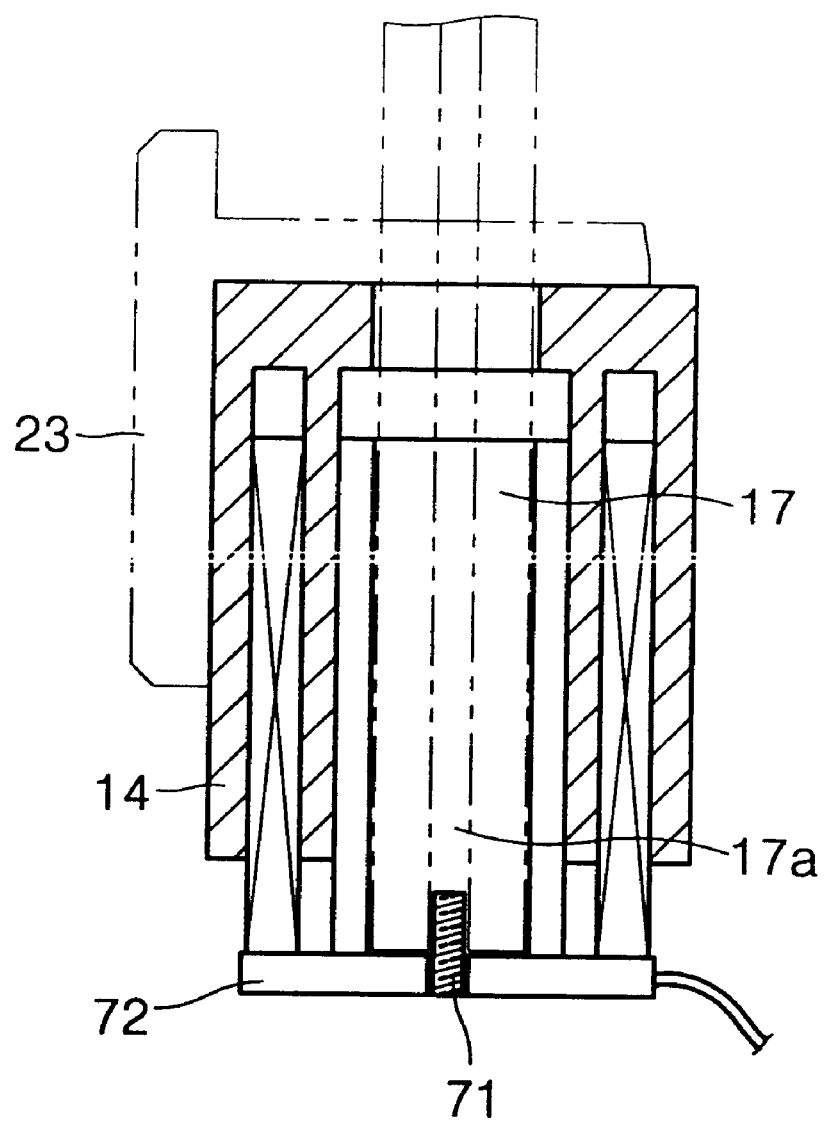
FIG. 10 is a partially cut-away sectional view showing a voice coil motor and a linear position transformer.

FIG. 10 is a sectional view showing the relative relationship between the voice coil motor and the linear position transformer. Referring to the drawing, the hollow type voice coil motor 14 is installed inside the upper portion 23 of the housing 11. The linear position transformer 17 is inserted in the hollow of the voice coil motor 14 and fixed to the upper portion 23 of the housing 11. The moving portion 72 is installed at the voice coil motor 14 and includes a cylindrical portion inserted in an outer cylindrical housing of the voice coil motor 14 and a circular portion attached to the bottom surface of the cylindrical portion. The moving portion 72 is a portion for performing an elevation movement according to the driving of the voice coil motor 14.

The linear position transformer 17 is provided with a moving portion 17a which is inserted in the outer housing of the linear position transformer 17 formed to be a cylinder as a whole, as shown in FIG. 2, and can elevate therein. One side of the moving portion 17a of the linear position transformer 17 is fixed by a screw 71 with respect to the bottom surface of the moving portion 72 of the voice coil motor 14. Thus, when the moving portion 72 of the voice coil motor 14 moves up and down, the moving portion 17a of the linear position transformer 17 can move up and down together.

As it is well known to the public, the linear position transformer 17 is a sort of micro sensor which can measure a change of linear displacement according to the movement of the moving portion 17a of the linear position transformer 17 in units of microns. The basic principle and structure of the linear position transformer 17 are disclosed in U.S. Pat. No. 5,345,206. The moving portion 72 of the voice coil motor 14 moves up and down at ultra high speed. When the initial position is set, a signal is transmitted to the linear position transformer 17 according to the position and height of each part. The moving portion 72 of the voice coil motor 14 moves down vertically at high speed according to the control by the linear position transformer 17. For example, the linear position transformer 17 reduces the speed of the moving portion 72 of the voice coil motor 14 at 1 mm above the top of a part so that the absorbing nozzle 41 can approach the part at low speed. When the part is gripped, the above-described operation is performed in reverse order. When the part is mounted on a printed circuit board, such an operation is performed. When the descending speed of the absorbing nozzle 41 is reduced at the position where the absorbing nozzle 41 approaches the part, impact by the absorbing nozzle 41 to the part can be avoided. The electronic parts absorbed by the absorbing nozzle 41 can be prevented from being released from the end portion of the absorbing nozzle 41 due to abrupt ascending or descending of the spindle 84. Also, as the operation speed of the voice coil motor can be faster at the position that is not the deceleration period, the absorbing and mounting of parts is performed.

The linear position transformer 17 detects the amount of movement of the moving portion 72 of the voice coil motor 14 and controls the speed of the voice coil motor 14 at a predetermined position. That is, the operation of the voice coil motor 14 is automatically read by the linear position transformer 17 and the acceleration and deceleration of the speed of the voice coil motor 14 is made at the set position.

Figure 11:
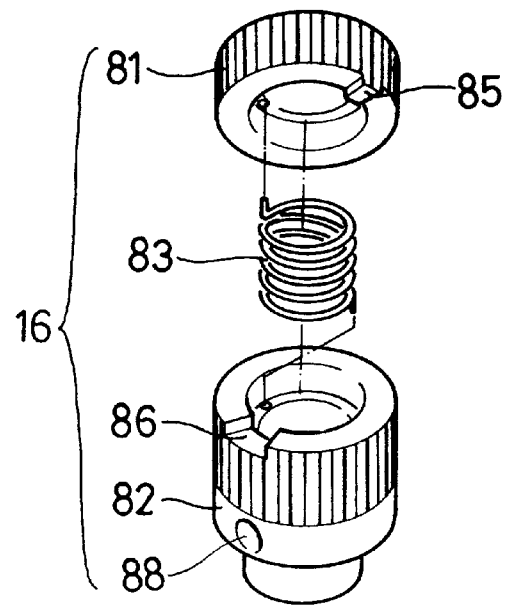
FIGS. 11 and 12 are exploded perspective views showing a pinion gear.

FIG. 11 shows the pinion gear 16 installed at the outer circumferential surface of the spindle tube 85. Referring to the drawing, the pinion gear 16 includes a first gear 81 and a second gear 82. A spring 83 is installed between the first and second gears 81 and 82. A protrusion 85 is formed at the bottom surface of the first gear 81 and a groove 86 is formed at the upper surface of the second gear 82 so that the protrusion gear 85 can be inserted in the groove 86. As the circumferential length of the groove 86 is formed to be greater than that of the protrusion 85, the first and second gears 81 and 82 can independently rotate for a predetermined distance with respect to each other. The one end and the other end of the spring 83 are fixed to the first gear 81 and the second gear 82, respectively.

In the pinion gear 16 having the above structure, the second gear 82 is fixed to the spindle tube 85 shown in FIG. 8 while the first gear 82 is not directly fixed to the spindle tube 85. Reference numeral 88 denotes a hole for inserting a screw when the pinion gear 16 is fixed to the spindle tube 85. The pinion gear 16 is engaged with the rack gear 15 shown in FIG. 2. When backlash is generated between the rack gear 15 and the pinion gear 16 during forward or reverse rotation thereof, such backlash can be compensated for by an elastic force of the spring 83.

Figure 12:
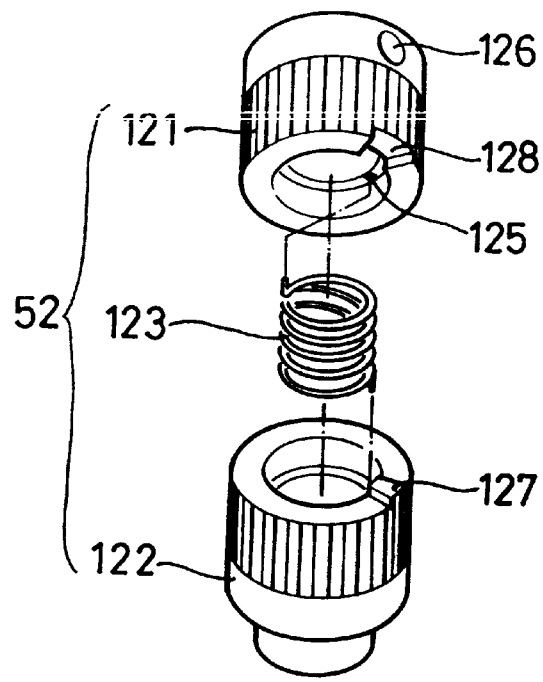

FIG. 12 shows the pinion gear 52 coupled to the rotation shaft of the rack gear driving motor 51 shown in FIG. 5. Referring to the drawing, the overall structure of the pinion gear 52 is similar to that of the pinion gear 16 shown in FIG. 11. That is, the pinion gear 52 includes a first gear 121, a second gear 122 and a spring 123 installed between the first and second gears 121 and 122. In the pinion gear 52, a groove 128 is formed at the first gear 121 while a protrusion 127 is formed at the second gear 122. The circumferential length of the groove 128 is formed to be greater than that of the protrusion 127. The first gear 121 is fixed to the rotation shaft of the driving motor 51. Reference numeral 126 denotes a through hole through which a screw is inserted for fixing to the rotation shaft of the driving motor 51. Reference numeral 125 denotes an insertion hole in which one end of the spring 123 is inserted. Although not shown in the drawing, another insertion hole for inserting the other end of the spring 123 is formed at the second gear 122. Due to the above structure, backlash generated between the pinion gear 52 and the rack gear 15 can be prevented.

In the operation of the head assembly for the part mounting apparatus according to the present invention, the head assembly of the present invention is operated by a typical linear reciprocation driving robot. The head assembly reciprocates between a part tray (not shown) where parts are placed and the printed circuit board B (see FIG. 5) and mounts the parts on the surface of the printed circuit board.

When the head assembly arrives at the part tray or the upper portion of the printed circuit board, the rod housing 21 and 22 descends by operation of the voice coil motor 14 the linear guide 38 and the slide bearing 39 guided the elevation operation of the rod housings 21 and 22. According to the descending movement of the rod housings 21 and 22, the spindle 84 shown in FIG. 8 descends with respect to the ball spline 87. Here, the linear position transformer 17 detects and controls the position and speed of the voice coil motor 14.

When the absorbing nozzle 41 arrives above a part placed on the part tray, a vacuum is provided so that the part can be absorbed by the absorbing nozzle 41. Contrarily, when the part absorbed by the absorbing nozzle 41 arrives at the position for mounting the part on the printed circuit board, the vacuum state is removed so that the part can be mounted on the printed circuit board.

To set the position of a part and align the parts, the rack gear driving motor 51 installed at the side surface of the housing 11 is driven to rotate the absorbing nozzle 41. As the pinion gear 52 installed at the end portion of the rack gear driving motor 51 rotates, the rack gear 15 reciprocates by being guided by the slide bearing 31 and the linear guide 30. Here, as the pinion gear 16 installed at each spindle unit 40 is engaged with the rack gear 15, the spindle unit 40 rotates as the rack gear 15 reciprocates. Accordingly, the absorbing nozzle 41 can rotate. Here, the rotation of the absorbing nozzle 41 is made possible by the ball bearings 91, 92 and 93 installed outside the spindle unit 40. The backlash generated between the rack gear 15 and the pinion gears 16 and 52 can be prevented due to the above structure described with reference to FIGS. 11 and 12.

The head assembly for the part mounting apparatus according to the present invention has merits as follows.

First, as a plurality of spindle motors are simultaneously operated, rapid part mounting is possible.

Second, at the elevation of the spindle unit is detected and controlled by the hollow type voice coil motor and the linear position transformer, rapid and accurate part mounting is possible.

Third, as the rotation of the spindle unit is made by the pinion and the rack gear, mechanical durability is provided.

Fifth, as the linear position transformer controls the operation of the voice coil motor, impact to the part generated when the part is mounted is removed so that damage to a part is prevented.

It is noted that the present invention is not limited to the preferred embodiment described above, and it is apparent that variations and modifications by those skilled in the art can be effected within the spirit and scope of the present invention defined in the appended claims.

What is claimed is:

1. A head assembly for a part mounting apparatus comprising:
   a housing;
   a plurality of rod housings;
   a plurality of voice coil motors fixed to the housing to elevate the rod housings with respect to the housing;
   a plurality of spindle motors, each having a part picking device at an end portion thereof, the spindle motors being rotated and elevated with respect to the respective rod housings according to the elevation of the rod housings; and a plurality of linear position transformers installed at the respective voice coil motors for detecting and controlling the position of elevation of the rod housings;

a first fear installed at an outer circumferential surface of each of the spindle units for rotating each spindle unit;

a rack gear engaged with the first gear and linearly reciprocating with respect to the housing; and a driving means installed at one side of the housing for driving the rack gear to linearly reciprocate.

2. The head assembly as claimed in claim 1, wherein the driving means is a motor installed at one side of the housing and a second gear installed at a rotation shaft of the motor is engaged with the rack gear.

3. The head assembly as claimed in claim 1, wherein the driving motor is a linear motor which is installed to make the rack gear perform a linear movement.

4. A head assembly for a part mounting apparatus comprising:

a housing;

a plurality of rod housings;

a plurality of voice coil motors fixed to the housing to elevate the rod housings with respect to the housing;

a plurality of spindle motors, each having a part picking device at an end portion thereof, the spindle motors being rotated and elevated with respect to the respective rod housings according to the elevation of the rod housings; and a plurality of linear position transformers installed at the respective voice coil motors for detecting and controlling the position of elevation of the rod housings;

wherein the housing comprises an upper portion wherein an insertion hole for inserting the linear position transformer is formed and a body portion where an insertion hole for inserting the spindle motor is formed, and a rack gear guide installation surface where the rack gear is installed is formed between the upper portion and the body portion.

5. A head assembly for a part mounting apparatus comprising:

a housing;

a plurality of rod housings;

a plurality of voice coil motors fixed to the housing to elevate the rod housings with respect to the housing;

a plurality of spindle motors, each having a part picking device at an end portion thereof, the spindle motors being rotated and elevated with respect to the respective rod housings according to the elevation of the rod housings; and a plurality of linear position transformers installed at the respective voice coil motors for detecting and controlling the position of elevation of the rod housings;

wherein each of the rod housings comprises a pair of a first rod housing and a second rod housing, a coupling surface coupled to a moving portion of the voice coil motor and an insertion hole for inserting the spindle unit are formed at the upper portion of each of the rod housings, and the insertion holes formed in the first and second rod housings are linearly arranged while the coupling surfaces are arranged to be separated far apart from one another.

6. A head assembly for a part mounting apparatus comprising:

a housing;

a plurality of rod housings;

a plurality of voice coil motors fixed to the housing to elevate the rod housings with respect to the housing;

a plurality of spindle motors, each having a part picking device at an end portion thereof, the spindle motors being rotated and elevated with respect to the respective rod housings according to the elevation of the rod housings;

a plurality of linear position transformers installed at the respective voice coil motors for detecting and controlling the position of elevation of the rod housings; and first and second pinion gears fixed to an outer circumferential surface of the spindle unit and the driving motor, respectively;

wherein each of the pinion gears has first and second gears having at least one pair of a protrusion and a groove and a spring elastically and rotatably supported between the first and second gears.

7. A head assembly for a part mounting apparatus comprising:

a housing;

a plurality of rod housings;

a plurality of voice coil motors fixed to the housing to elevate the rod housings with respect to the housing;

a plurality of spindle motors, each having a part picking device at an end portion thereof, the spindle motors being rotated and elevated with respect to the respective rod housings according to the elevation of the rod housings; and a plurality of linear position transformers installed at the respective voice coil motors for detecting and controlling the position of elevation of the rod housings;

wherein a hollow portion is formed in the voice coil motor, the linear position transformer is inserted in the hollow portion, and one side of the linear position transformer is connected to the moving portion of the voice coil motor so that the position of the moving portion of the voice coil motor is detected and controlled.

* * * * *